(12) United States Patent
Lin et al.

(10) Patent No.: US 7,368,383 B2
(45) Date of Patent: May 6, 2008

(54) HILLOCK REDUCTION IN COPPER FILMS

(75) Inventors: Shih-Chi Lin, Shin-Chu (TW); Francis Wang, Zhubei (TW); Wen-Long Lee, Taipei (TW); Sez-An Wu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 72 days.

(21) Appl. No.: 11/136,238

(22) Filed: May 24, 2005

(65) Prior Publication Data
US 2006/0270227 A1    Nov. 30, 2006

(51) Int. Cl.
*H01L 21/44* (2006.01)

(52) U.S. Cl. .................. 438/687; 438/633; 438/906; 257/E21.304

(58) Field of Classification Search ........ 257/E21.304; 438/633, 687, 906
See application file for complete search history.

(56) References Cited

U.S. PATENT DOCUMENTS

| 5,409,862 | A | 4/1995 | Wada et al. |
|---|---|---|---|
| 5,661,345 | A | 8/1997 | Wada et al. |
| 5,770,515 | A | 6/1998 | Meng et al. |
| 5,994,217 | A | 11/1999 | Ng |
| 6,297,158 | B1 | 10/2001 | Liu et al. |
| 6,716,749 | B2 * | 4/2004 | Noguchi et al. ............ 438/677 |
| 6,730,594 | B2 * | 5/2004 | Noguchi et al. ............ 438/653 |
| 6,787,462 | B2 * | 9/2004 | Iijima et al. ................ 438/680 |
| 2003/0001277 | A1 * | 1/2003 | Noguchi et al. ............ 257/773 |
| 2003/0136423 | A1 * | 7/2003 | Akbar et al. .................... 134/3 |

* cited by examiner

*Primary Examiner*—Asok Kumar Sarkar
(74) *Attorney, Agent, or Firm*—Duane Morris LLP

(57) ABSTRACT

A method for treating a copper surface of a semiconductor device provides exposing the copper surface to a citric acid solution after the surface is formed using CMP (chemical mechanical polishing) or other methods. The citric acid treatment may take place during a cleaning operation that takes place in a wafer scrubber, or subsequent to such an operation. The citric acid treatment removes copper oxides that form on copper surfaces exposed to the environment and prevents hillock formation during subsequent high temperature operations. The copper surface is then annealed and the annealing followed by an $NH_3$ plasma treatment which again removes any copper oxides that may be present. The $NH_3$ plasma operation roughens exposed surfaces improving the adhesion of subsequently-formed films such as a dielectric film preferably formed in-situ with the $NH_3$ plasma treatment. The subsequently-formed film is formed over an oxide-free, hillock-free copper surface.

15 Claims, 3 Drawing Sheets

HILLOCK REDUCTION IN COPPER FILMS

FIELD OF THE INVENTION

The present invention relates most generally to semiconductor device manufacturing and more specifically to the formation of copper interconnect structures.

BACKGROUND

In today's rapidly advancing semiconductor manufacturing industry, copper is becoming increasingly favored as the interconnect material of choice. The use of copper as the interconnect medium maximizes device speed but also requires special processing because of difficulties in patterning, corrosion concerns, the rapid oxidation of exposed copper surfaces and the tendency of copper alloys to form hillocks.

When a copper alloy interconnect becomes oxidized, the quality of a contact made to the copper surface decreases, for example, contact resistance increases. Therefore, it is desirable to remove copper oxides that form on copper surfaces, even native copper oxides that form in the brief duration between processing operations. Various treatment procedures have been used to remove the oxidized portion of the copper film and the conventional procedures enjoy various degrees of success in removing part of the oxidized copper. When an uneven or discontinuous copper oxide is not completely removed by such a treatment operation designed to remove the copper oxide, subsequent thermal heat treatment processes such as conventional annealing processes cause the formation of hillocks preferentially at void locations between intact portions of the Cu oxide that remains over the copper. A high concentration of hillocks may cause future patterning problems and hillocks invariably cause shorting problems between the copper and overlying layers of conductive material as the high aspect ratio of the hillocks enables them to protrude through subsequently deposited and planarized insulating materials. In contrast, non-oxidized copper surfaces are resistant to hillock formation during subsequent thermal processing.

As such, it would be desirable to provide a copper surface treatment procedure that produces a copper structure free of oxides and hillocks and enables a dielectric film to be subsequently formed over the copper surface that remains oxide-free and hillock-free. The present invention is directed to and provides such procedures.

SUMMARY OF THE INVENTION

To address these and other needs and in view of its purposes, the present invention provides a method for treating the copper surface of a semiconductor device. In one embodiment, the method includes forming a copper film having a copper surface, exposing the copper surface to citric acid and, treating the copper surface with an $NH_3$ plasma.

In another embodiment, the present invention provides a method for treating the copper surface of a semiconductor device. The method includes forming a copper film having a copper surface, exposing the copper surface to citric acid, annealing at a temperature within the range of 300-410° C. after the citric acid exposure, treating the copper surface with an $NH_3$ plasma, and depositing a dielectric over the copper surface after the $NH_3$ treatment.

In still another embodiment, the present invention provides a method for treating the copper surface of a semiconductor device. The method includes forming a copper film having a copper surface over a substrate, cleaning the copper surface using a scrubber, the cleaning using citric acid at room temperature, treating the copper surface with an $NH_3$ plasma, and depositing a dielectric over the copper surface after the $NH_3$ treatment

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The present invention provides treatment operations that prevent the oxidation of exposed copper surfaces and/or remove copper oxides that have formed on exposed copper surfaces and provide for the formation of a dielectric or other film over the oxide-free, hillock-free copper surface. Copper interconnect features are typically formed using damascene processing techniques such as illustrated in the figures, but it should be understood that the copper surface treatment of the present invention may be just as easily used to treat copper surfaces of copper interconnect structures and other copper features formed using different techniques.

Figure 1:
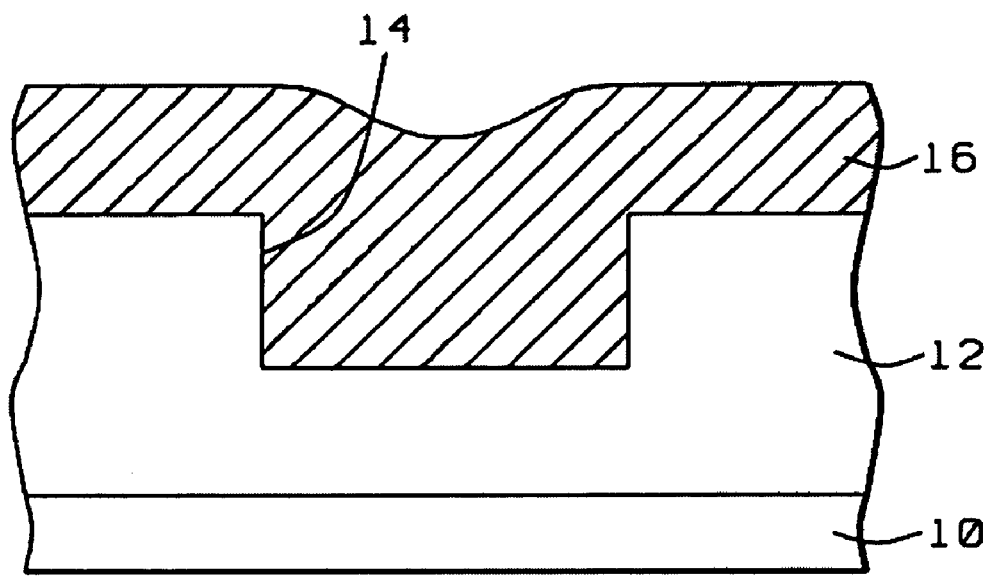
FIGS. 1-5 are each cross-sectional views and together illustrate a processing sequence in which the copper surface treatment procedure of the present invention is used to treat a copper surface onto which a dielectric film is subsequently formed.

FIG. 1 is an exemplary cross-sectional view showing dielectric film 12 formed over substrate 10. Substrate 10 may be a conventional substrate used in the semiconductor manufacturing industry and dielectric 12 may be any of various suitable dielectric materials which may be oxide or nitride based. In one embodiment, dielectric 12 may be FSG, fluorine-doped silicate glass, which is a material formed by adding fluorine to $SiO_2$ to provide a reduced dielectric constant relative to $SiO_2$. Dielectric 12 includes opening 14, which is a damascene opening and may be formed using conventional methods. Copper 16 is formed over dielectric 12 and fills opening 14. Various deposition or evaporation techniques may be used to form copper 16. Copper 16 may be pure copper or it may be an alloy such as CuSi or other CuSi-based alloys.

Figure 2:
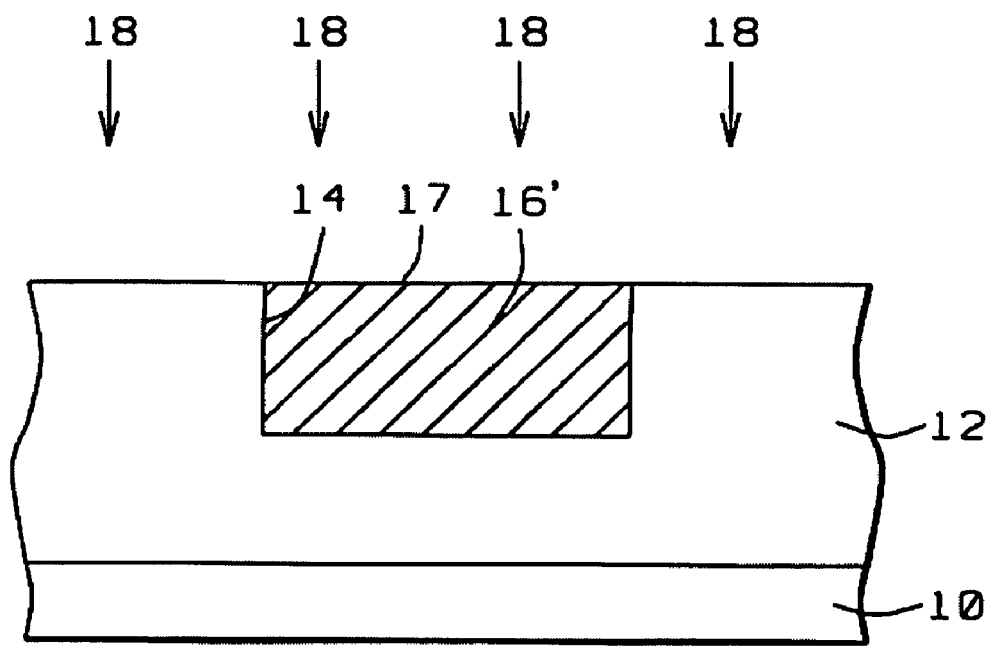

The structure of FIG. 1 then undergoes a chemical mechanical polishing, CMP, operation that planarizes the structure and removes copper 16 from over dielectric 12, leaving a copper interconnect structure within opening 14 as shown in FIG. 2. FIG. 2 shows the structure of FIG. 1 after the CMP polishing operation and shows copper interconnect 16' with exposed Cu surface 17. When the structure of FIG. 2 is exposed to ambient environment 18, such as after the CMP procedure has been completed and the device is being transported to a further processing operation, a native copper oxide film forms on the exposed Cu surface 17 due to the oxidation of Cu surface 17 to form copper oxide.

Figure 3:
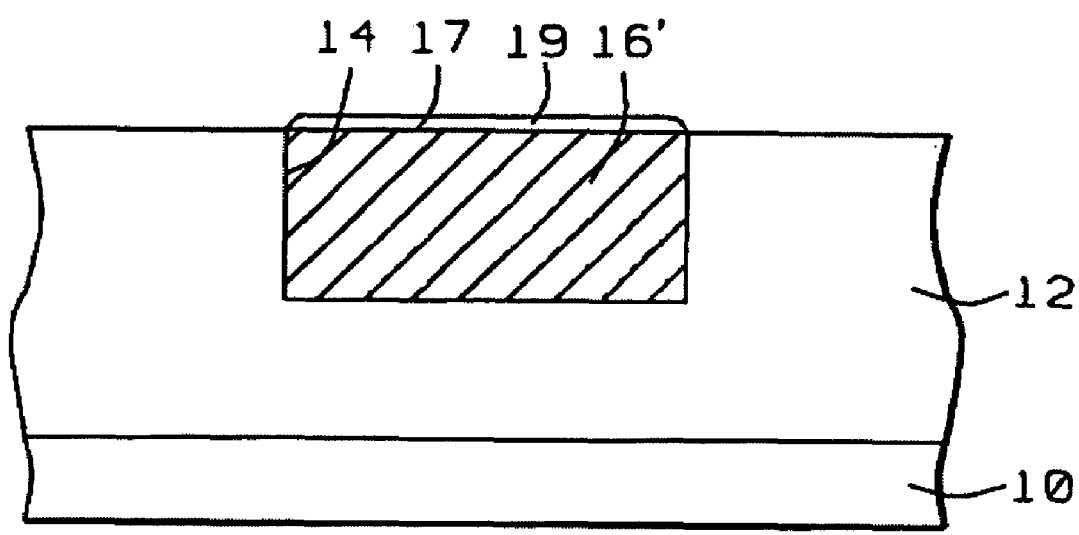

Now turning to FIG. 3, oxide film 19 is illustrated as being formed on Cu surface 17. It is an object of this invention to remove oxide film 19 from Cu surface 17 and to maintain Cu surface 17 oxide-free up to the point at which a dielectric or other film is formed over Cu surface 17.

After the CMP polishing operation, the surface of the semiconductor device may advantageously be cleaned using a scrubber that scrubs the exposed surface. The present invention provides treating the post-CMP copper surface (Cu surface 17) with citric acid, 2-hydroxy 1, 2, 3, propanetricarboxylic acid. The citric acid treatment may take place following a conventional scrubbing operation or the citric acid treatment may take place during the scrubbing operation. The scrubbing operation may include various other portions such as rinses and drying procedures.

According to the embodiment in which the citric acid treatment takes place during the scrubbing operation, the citric acid may be maintained at room temperature and the scrubbing may take place in a scrubber manufactured by DNS Electronics, such as DNS Electronics FL-820-L Wafer Scrubber, but other wafer scrubbers manufactured by other manufacturers, may be used. When following the scrubbing operation, the citric acid treatment may take place using conventional wet processing methods. The citric acid treatment may take place for a time ranging from 1 to 3 minutes, at a temperature ranging from 15° C. to 30° C. and using a citric acid solution having a citric acid concentration ranging from 0.2% to 2%. The citric acid treatment advantageously and selectively removes copper oxides such as oxide film 19 from Cu surface 17. After the citric acid treatment, the structure may be annealed at a temperature within the range of 300-410° C. The formation of hillocks during this annealing procedure is minimized or eliminated because Cu surface 17 is substantially completely oxide-free prior to the annealing operation. The annealing operation should follow the citric acid treatment as soon as possible, and will desirably take place within 8 hours of the citric acid treatment.

Figure 4:
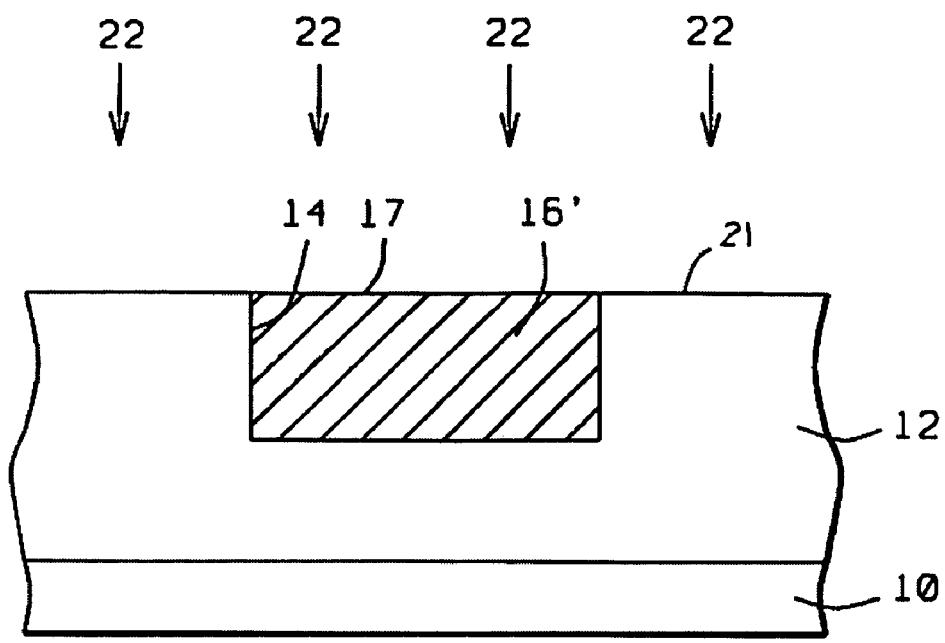
Figure 5:
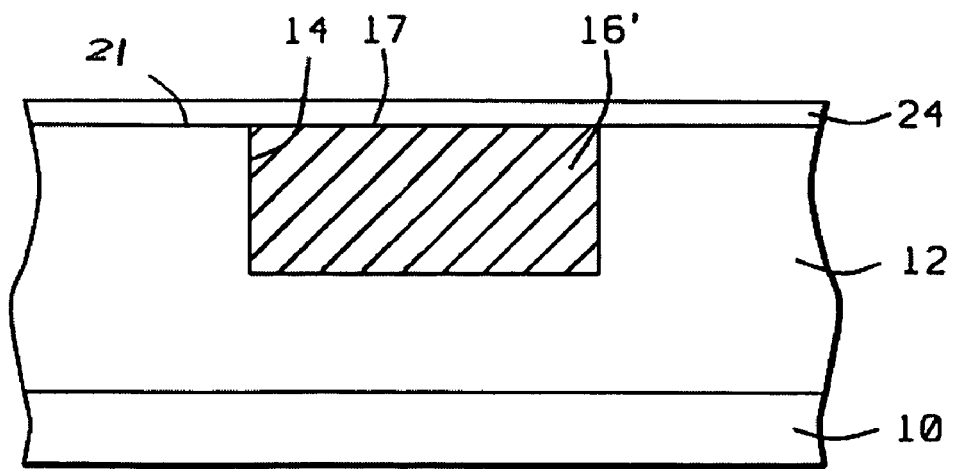

After the annealing operation and before a subsequent film is formed over the structure, an $NH_3$ plasma operation is performed. The $NH_3$ plasma operation is carried out as quickly as possible following the annealing process and advantageously within 8 hours of the annealing operation. The $NH_3$ plasma may be generated using conventional means and conventional methods may be used to direct the $NH_3$ plasma to the substrate surface. The $NH_3$ plasma operation may take place for a time ranging from 10 to 40 minutes, at a temperature ranging from 300° C. to 410° C. The $NH_3$ plasma operation removes any oxide films that may have formed on Cu surface 17 following the citric acid treatment, and it roughens surface 21 of dielectric 12 and Cu surface 17 of copper interconnect 16' as shown in FIG. 4. The $NH_3$ plasma is depicted by arrows 22 as being directed toward the upper surface of the structure of FIG. 4. The $NH_3$ plasma bombards the surfaces 17 and 21 to increase surface roughness which improves adhesion between the surface and a film formed thereon such as shown in FIG. 5. The $NH_3$ plasma treatment advantageously takes place no more than 8 hours after the citric acid treatment to minimize hillock formation.

FIG. 5 shows dielectric film 24 formed on Cu surface 17 and dielectric surface 21. In an exemplary embodiment, the operation used to form dielectric film 24 is carried out in-situ with the $NH_3$ plasma treatment. In one embodiment, after the $NH_3$ plasma treatment operation is concluded, $SiH_3$ gas may be added to the gas composition and the processing conditions altered to produce the formation of a silicon nitride film as dielectric film 24. In other exemplary embodiments, an in-situ procedure may be used to form another dielectric material such as SiC as dielectric film 24. In other exemplary embodiments, other dielectric films may be formed over the structure. The dielectric film is formed over Cu surface 17 which is oxide-free since the $NH_3$ plasma operation removes any copper oxides formed and the dielectric film deposition process is carried out in-situ with the $NH_3$ plasma procedure.

Returning to FIG. 5, after dielectric film 24 is formed over this structure, subsequent processing operations may be carried out to form various semiconductor devices having various applications and which utilize copper interconnect 16'.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device comprising:
    forming a copper film and polishing said copper film to produce a copper surface;
    directly following said polishing, scrubbing said copper surface in a scrubbing operation that comprises citric acid;
    annealing after said scrubbing; and, thereafter
    treating said copper surface with an $NH_3$ plasma.

2. The method as in claim 1, further comprising depositing a dielectric over said copper surface after said treating.

3. The method as in claim 2, wherein said dielectric is one of silicon nitride and silicon carbide.

4. The method as in claim 2, wherein said dielectric comprises silicon nitride and is formed following said treating and in-situ with said treating and includes said $NH_3$ plasma as a reaction gas.

5. The method as in claim 1, wherein said forming a copper film comprises depositing said copper in an opening formed in a dielectric and over said dielectric and polishing to remove said copper from over said dielectric thereby forming said copper surface.

6. The method as in claim 5, wherein said dielectric comprises FSG.

7. The method as in claim 1, wherein said treating takes place no more than 8 hours after said exposing.

8. The method as in claim 1, wherein each of said treating and said scrubbing removes copper oxide present on said copper surface.

9. The method as in claim 1, wherein said annealing comprises annealing at a temperature within the range of 300-410° C.

10. The method as in claim 1, wherein said treating comprises a temperature of about 300° C. to 410° C.

11. A method for treating a copper surface of a semiconductor device, said method comprising:
    forming a copper film over a substrate and polishing said copper film to produce a copper surface:
    directly following said polishing, cleaning said copper surface in a scrubber, said cleaning comprising citric acid at room temperature;
    annealing after said cleaning;
    treating said copper surface with an $NH_3$ plasma after said annealing; and
    depositing a dielectric over said copper surface after said treating.

12. The method as in claim 11, wherein said annealing takes place at a temperature within the range of 300-400° C. and within 8 hours of said cleaning.

13. The method as in claim 11, wherein said forming a copper film comprises depositing said copper film in an opening formed in a dielectric and over said dielectric and said polishing removes said copper from over said dielectric thereby forming said copper surface, said dielectric comprises FSG, and conditions of said treating are chosen to cause said $NH_3$ to roughen exposed surfaces of said dielectric and said copper surface.

14. A method for treating a copper surface of a semiconductor device, said method comprising:
    forming a copper film having a copper surface;
    exposing said copper surface to citric acid;
    annealing at a temperature within the range of 300-400° C. directly after said exposing;
    treating said copper surface with an $NH_3$ plasma directly after said annealing; and
    depositing a dielectric over said copper surface after said treating.

15. The method as in claim 14, wherein said exposing comprises contacting said copper surface with a wet chemical solution that includes said citric acid and is at about room temperature and each of said treating and said exposing removes copper oxide present on said copper surface.

* * * * *

UNITED STATES PATENT AND TRADEMARK OFFICE
CERTIFICATE OF CORRECTION

| | | |
|---|---|---|
| PATENT NO. | : 7,368,383 B2 | Page 1 of 1 |
| APPLICATION NO. | : 11/136238 | |
| DATED | : May 6, 2008 | |
| INVENTOR(S) | : Shih-Chi Lin et al. | |

It is certified that error appears in the above-identified patent and that said Letters Patent is hereby corrected as shown below:

Column 5, line 21, delete "surface:" and insert -- surface; -- therefor.

Column 6, line 2, delete "300-400° C" and insert -- 300-410° C -- therefor.

Column 6, line 16, delete "300-400° C" and insert -- 300-410° C -- therefor.

Signed and Sealed this

Eighth Day of July, 2008

JON W. DUDAS
*Director of the United States Patent and Trademark Office*